United States Patent
Price et al.

(10) Patent No.: US 8,754,646 B2
(45) Date of Patent: Jun. 17, 2014

(54) RAPID SAMPLE EXCHANGE FOR MINIATURIZED NMR SPECTROMETER

(75) Inventors: John C. Price, Longmont, CO (US); Charles Miller, Boulder, CO (US); Erick Winston, Boulder, CO (US)

(73) Assignee: Picospin, LLC, Boulder, CO (US)

(*) Notice: Subject to any disclaimer, the term of this patent is extended or adjusted under 35 U.S.C. 154(b) by 176 days.

(21) Appl. No.: 13/171,230

(22) Filed: Jun. 28, 2011

(65) Prior Publication Data

US 2011/0316536 A1 Dec. 29, 2011

Related U.S. Application Data

(60) Provisional application No. 61/359,713, filed on Jun. 29, 2010.

(51) Int. Cl.
*G01V 3/00* (2006.01)

(52) U.S. Cl.
USPC .......................................... 324/321; 324/322

(58) Field of Classification Search
USPC .................... 324/321, 322, 307, 306
See application file for complete search history.

(56) References Cited

U.S. PATENT DOCUMENTS

| | | |
|---|---|---|
| 3,597,633 A | 8/1971 | Hirano |
| 3,735,306 A | 5/1973 | Kabler et al. |
| 4,761,614 A | 8/1988 | Prammer et al. |
| 4,782,295 A | 11/1988 | Lew |
| 4,785,245 A | 11/1988 | Lew et al. |
| 5,004,974 A | 4/1991 | Cattaneo et al. |
| 5,654,636 A | 8/1997 | Sweedler et al. |
| 5,684,401 A | 11/1997 | Peck et al. |
| 5,705,928 A * | 1/1998 | Haner et al. .................. 324/321 |
| 5,773,976 A | 6/1998 | Sakakura et al. |
| 5,818,228 A * | 10/1998 | Menon et al. .................. 324/300 |
| 5,858,154 A | 1/1999 | Toki |
| 6,097,188 A | 8/2000 | Sweedler et al. |
| 6,456,072 B1 | 9/2002 | Webb et al. |
| 6,700,379 B2 * | 3/2004 | Peck et al. .................... 324/321 |
| 6,788,061 B1 | 9/2004 | Sweedler et al. |
| 6,822,454 B2 | 11/2004 | Peck et al. |
| 7,141,978 B2 | 11/2006 | Peck et al. |
| 7,429,860 B2 * | 9/2008 | Taylor et al. .................. 324/307 |
| 2002/0140425 A1 | 10/2002 | Prammer et al. |

(Continued)

OTHER PUBLICATIONS

Andrew G. Webb, Radiofrequency Microcoils in Magnetic Resonance, Jan. 27, 1997, Department of Electrical and Computer Engineering, University of Urbana-Champaign.

(Continued)

*Primary Examiner* — Louis Arana
(74) *Attorney, Agent, or Firm* — Michael C. Staggs

(57) ABSTRACT

A method is provided for acquiring multiple NMR response signal data in rapid succession for averaging NMR spectral data from a sample. The fluid sample is placed in a capillary that extends through the magnetic field of the NMR spectrometer, including through the center of the magnetic field to place a segment of the sample in the magnetic center. After the sample fluid, initially magnetized by the magnetic field, is activated to emit an NMR pulse signal, the fluid in the capillary is advanced rapidly to put another pre-magnetized segment of the sample fluid in the fluid center, acquiring an NRM pulse signal, and continuing the cycle until a desired number of NMR response data signals from the sample have been acquired. Those response data from multiple acquisitions are then averaged.

3 Claims, 1 Drawing Sheet

Rapid Sample Exchange

(56) References Cited

U.S. PATENT DOCUMENTS

| | | |
|---|---|---|
| 2002/0149369 A1 | 10/2002 | Peck et al. |
| 2003/0020476 A1 | 1/2003 | Duensing |
| 2005/0030033 A1 | 2/2005 | Peck et al. |
| 2005/0253587 A1 | 11/2005 | Peck et al. |
| 2006/0213283 A1 | 9/2006 | Morris et al. |
| 2007/0132452 A1 | 6/2007 | Alsop |
| 2007/0164737 A1 | 7/2007 | Pusiol |
| 2008/0136416 A1 | 6/2008 | Goetz et al. |
| 2008/0186024 A1 | 8/2008 | Edwards |
| 2011/0137589 A1 | 6/2011 | Leskowitz et al. |

OTHER PUBLICATIONS

Odeblad, Coils for Microgram Samples and the Associated Circuitry, 1966, Acta Obstet Gynecol Scand, vol. 45, chptr 9, pp. 84-98 (downloaded from informahealthcare.com by University of Colorado Libraries on Aug. 10, 2010).

Alison Nordon, Colin A. McGill and David Littlejohn, Process NMR Spectrometry, Jan. 25, 2001, Department of Pure and Applied Chemistry, Glasgow, UK.

Y. Maguire et al., Toward a table-top quantum computer, IBM Systems Journal, vol. 39 Nos. 3&4, 2000, pp. 823-939.

* cited by examiner

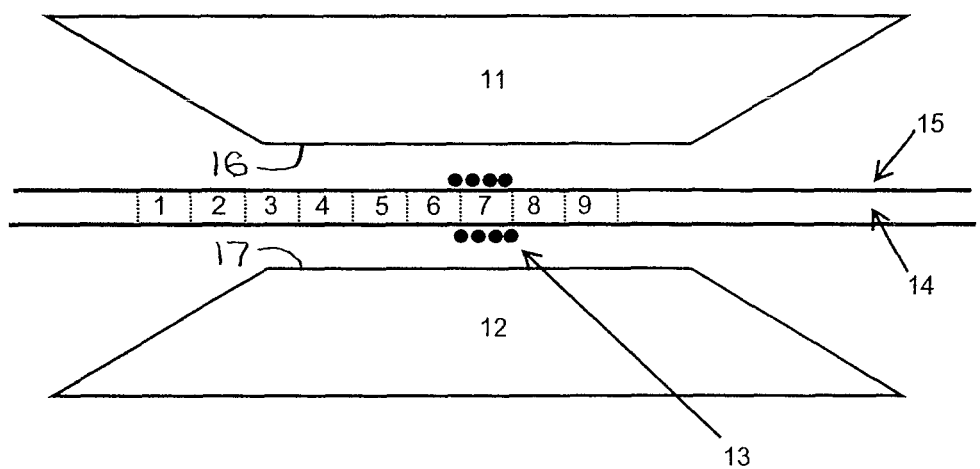
Rapid Sample Exchange

RAPID SAMPLE EXCHANGE FOR MINIATURIZED NMR SPECTROMETER

CROSS REFERENCE TO RELATED APPLICATION

The present application is based upon and claims the benefit of U.S. Provisional Patent application No. 61/359,713, titled "Rapid Sample For Miniaturized NMR Spectrometer," filed Jun. 29, 2010 by John c. Price. The entire content of the above-mentioned application is hereby specifically incorporated herein by reference for all it discloses and teaches.

BACKGROUND OF THE INVENTION

In typical NMR spectrometers, a sample is placed in a region of uniform magnetic field, for example, between pole pieces of a magnet assembly. A wire coil and electronic circuits are provided to both apply radio-frequency (RF) pulses to the sample (transmit) and to detect RF signals from the sample (receive). In a typical experiment or measurement, the protons (or other nuclei under study) in the sample are first allowed to polarize in the magnetic field. Establishing equilibrium polarization takes a time which is known as $T_1$ in the NMR art. This time ranges from a fraction of a second up to 20 seconds, depending on the composition of the liquid sample. Next, one or more RF pulses are applied to the sample with frequencies at or near the resonance frequency at which the protons freely precess in the applied uniform magnetic field. The transmit pulses have the effect of tilting the proton polarization relative to the direction of the applied field. After the transmit pulse is ended the protons precess and create a time-varying magnetic field in the coil. The time-varying field induces a signal voltage in the coil which may be amplified and recorded. Either immediately, or after a delay time, the receive signal is recorded and transferred to a computer for processing.

A particular sequence of transmit pulses, delay times and data acquisition periods, together with all of the parameters needed to precisely define the sequence (times, frequencies, phases, acquisition rates) is know in the NMR art collectively as a pulse sequence. The design of NMR pulse sequences to extract desired information from a sample is a well-developed area of knowledge. A great variety of pulse sequences are known in the art, ranging from simple ones with a single transmit pulse and a single data acquisition time to much more complex sequences with many transmit pulses, time delays, transmitter phase and amplitude adjustments, and data acquisition periods. The goals of these sequences vary widely, including enhancement of spectroscopic resolution, enhancement of signal-to-noise ratio, detection of spin-spin coupling between different groups of protons (or other nuclei), suppression of strong solvent signals, suppression of coupling between like or unlike nuclei, transfer of polarization from one group of nuclei to another, measurement of relaxation rates, measurement of diffusion within the fluid and measurement of fluid flow.

The foregoing examples of related art and limitations related therewith are intended to be illustrative and not exclusive. Other limitations of the related art will become apparent to those skilled in the art upon a reading of the specification and a study of the drawings.

BRIEF DESCRIPTION OF THE DRAWING

The accompanying drawings, which are incorporated herein and form a part of the specification, illustrate some, but not the only or exclusive, example embodiments and/or features. It is intended that the embodiments and figures disclosed herein are to be considered illustrative rather than limiting.

In the drawings:

FIG. 1 is a diagrammatic elevation view of an example NMR magnet system with a coil and flow-through sample capillary diagrammatically sectioned to illustrate discrete sample portions of the sample fluid in the sample capillary.

DESCRIPTION OF EXAMPLE IMPLEMENTATIONS

In many NMR spectrometer applications, the signal-to-noise ratio (SNR) of some or all spectral lines obtained in NMR data may be too low to obtain useful information from a "single shot" spectrum, i.e., from one sequence of RF excitation followed NMR data acquisition from the resulting NMR decay signal. SNR is particularly problematic for small samples, complex spectra with many lines, for studies of molecules which are at low concentration in a solution, and for nuclear species with low precession frequencies and/or low isotopic abundance. In these cases, it is useful to average many identical pulse sequences to obtain higher SNR. For example, if a pulse sequence could be repeated three times per second for ten minutes, the SNR could be improved by a factor of $\sqrt{10*60*3}=42.4$, a very significant improvement.

However, using methods know in the NMR art, repeating a pulse sequence at this rate is not normally possible. After the spin precession signal has decayed away, it is not normally possible to immediately apply a second transmitter pulse because the equilibrium polarization will not have recovered yet at the time the sequence ends. Polarization recovery usually occurs exponentially with a recovery time-constant that is known as $T_1$ in the NMR art. For low-viscosity solutions, $T_1$ is typically between 0.1 and 10 seconds. If quantitative integration of spectral lines is not required, it may be sufficient to wait a time $2\,T_1$ between repetitions of the pulse sequence, but in other cases delays as long as $5\,T_1$ must be used. Thus the repetition rate may be more than 100 times slower than was suggested above.

The method illustrated schematically in FIG. 1 and described below allows a short repetition delay even when $T_1$ is long. The method is specific to a capillary NMR spectrometer in which the capillary 15 contains the fluid sample 14 and the sample 14 is delivered to the NMR RF coil 13 or coils by flow. Moreover the method is most effective in a small or miniature NMR spectrometer in which the capillary 15 is relatively short. In the FIG. 1, the magnet pole pieces 11, 12 have planar or nearly planar pole faces 16, 17, respectively. The capillary 15 is filled with a homogeneous sample fluid 14. The NMR RF coil 13 is located at the geometric magnet center and in close proximity to the fluid-filled capillary 15. In this example, a single coil 13 is used for both the transmit and the receive modes, and the single coil 13 is wrapped around the capillary 15. Although the capillary 15 path is shows diagrammatically as straight in FIG. 1, this is not required. The capillary 15 may follow any path beginning outside of the magnet, passing through or near the RF coil 13, and then returning again to the region outside the magnet.

For the purposes of describing clearly the disclosed method, suppose that the fluid 14 in the capillary 15 is divided into a number of sequential segments in the capillary 15 labeled 1 through 9 in FIG. 1. There is no physical boundary between the segments 1-9. Initially, the fluid 14 is translated such that segment 1 is within the RF coil 13. The pulse sequence is then executed, and a data record is obtained.

Immediately after the data is recorded, the fluid 14 is rapidly translated such that segment 2 is moved to the location within the RF coil 13. The pulse sequence may then be immediately repeated, because the segment 2 of fluid 14 now in the RF coil 13, not having been disturbed by the execution of the first execution pulse sequence, is already fully polarized by the magnetic field. Immediately after the second execution, the fluid 14 is again translated such that segment 3 is moved to the location within the RF coil 13. Again the sequence may be repeated immediately, because the segment 3 of the fluid 14 now in the coil is fully polarized by the magnetic field. This process can be repeated indefinitely as long as each segment entering the coil 13 has spent enough time within the magnet pole gap to become fully polarized before that segment enters the RF coil 13. The capillary 15 path may meander within the magnet pole region sufficiently to ensure that this condition is met, or a pre-polarizer magnetic field could be provided if desired. Optionally, after a number of translations in one direction are completed, for example after the fluid segment 9 enters the coil 13, the fluid 14 may then be translated a larger distance in the opposite direction, for example so that segment 1 is again within the RF coil 13, after which the sequence of pulses, data acquisition, and translations may repeat. Alternately, the translations may continue in one direction for any number of steps. Any sequence of translations which continuously replaces the fluid 14 in the coil 13 region with polarized fluid 14 may be used.

Those skilled in the art of microfluidics will recognize and know how to implement myriad methods for translating the fluid 14 rapidly and in a controlled manner, once they understand the principles of this invention, including translating it under the control of digital signals from the NMR pulse sequencer or from the embedded supervisory processor. These methods include use of digital valves, fast micro valves, microfluidic pumps, sources of pressure, microfluidic fluid connectors, and microfluidic fluid channels. Those skilled in the art will also be able to determine translation times for various volumes, rates, and the like. For example, but not for limitation, readily the described fluid translations of distance of approximately 0.5 mm in a capillary with inside dimensions approximately 0.3 mm and total length of approximately 10 centimeters can be accomplished in a time of 10 milliseconds or less for typical low viscosity fluids of interest in NMR spectroscopy. This time is small compared to the execution time of typical pulse sequences. Consequently, this method nearly eliminates the delay time between repetitions of pulse sequences that is normally required.

Those skilled in the NMR art will know that many types of pulse sequence are used in the NMR art, as mentioned above, and that some are much more complex than others. The method described above can be used to eliminate repolarization time delays in any of these sequences.

The foregoing description provides examples that illustrate the principles of the invention, which is defined by the claims that follow. Since numerous insignificant modifications and changes will readily occur to those skilled in the art once they understand the invention, it is not desired to limit the invention to the exact example constructions and processes shown and described above. The words "comprise," "comprises," "comprising," "include," "including," and "includes" when used in this provisional application are intended to specify the presence of stated features, integers, components, or steps, but they do not preclude the presence or addition of one or more other features, integers, components, steps, or groups thereof.

What is claimed is:

1. A method of acquiring NMR spectral data from a fluid sample, comprising:
    placing the fluid sample in an elongated capillary that extends through a magnetic field, including through the center of the magnetic field as enabled by a pair of magnet pole pieces, to provide for a polarized fluid in the capillary;
    applying a first RF pulse sequence to a first segment of the polarized fluid in the capillary by way of an RF coil configured at the center of the magnetic field and acquiring NMR spectral data from resulting NMR spin precession decay;
    advancing the polarized fluid in the capillary enough so that a second segment of the polarized fluid that has not been subjected to the first RF pulse sequence moves into the center of the magnetic field; and
    applying a second RE pulse sequence that is identical to the first pulse sequence to the second segment of the polarized fluid in the capillary by way of the RE coil configured at the center of the magnetic field and acquiring NMR spectral data from NMR spin precession decay, resulting from the second RF pulse sequence.

2. The method of claim 1, including using the NMR spectral data from the first and second segments in calculations to obtain an average NMR spectral data.

3. The method of claim 1, including sequentially advancing a plurality of additional segments of polarized fluid in the capillary to the center of the magnetic field, applying the RF sequence to each segment in turn and acquiring NMR spectral date from each segment, respectively, and averaging the NMR spectral data acquired from all of the segments.

* * * * *